(12) United States Patent
Song

(10) Patent No.: US 9,071,247 B2
(45) Date of Patent: Jun. 30, 2015

(54) SEMICONDUCTOR DEVICE FOR PERFORMING PREEMPHASIS OPERATION

(75) Inventor: Seong-Hwi Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 246 days.

(21) Appl. No.: 13/610,506

(22) Filed: Sep. 11, 2012

(65) Prior Publication Data

US 2013/0113521 A1    May 9, 2013

(30) Foreign Application Priority Data

Nov. 8, 2011    (KR) .......................... 10-2011-0116036

(51) Int. Cl.
| | |
|---|---|
| *H03K 17/16* | (2006.01) |
| *H03K 19/20* | (2006.01) |
| *H03K 19/003* | (2006.01) |
| *H03K 19/0175* | (2006.01) |

(52) U.S. Cl.
CPC .......... *H03K 19/20* (2013.01); *H03K 19/00361* (2013.01); *H03K 19/017509* (2013.01)

(58) Field of Classification Search
None
See application file for complete search history.

(56) References Cited

U.S. PATENT DOCUMENTS

| | | | | |
|---|---|---|---|---|
| 6,130,563 | A * | 10/2000 | Pilling et al. ................... | 327/111 |
| 7,215,144 | B2 * | 5/2007 | Mitby et al. .................... | 326/82 |
| 2006/0002482 | A1 | 1/2006 | Walker et al. | |
| 2013/0076395 | A1 * | 3/2013 | Kim ............................... | 326/87 |

* cited by examiner

*Primary Examiner* — Jany Richardson
(74) *Attorney, Agent, or Firm* — IP & T Group LLP

(57) ABSTRACT

A semiconductor device includes: a main driving unit configured to receive an output data and to drive the received data to a data output pad; a pre-emphasis data generation unit configured to compare a delayed data obtained by delaying the output data by one data period with the output data, to delay the comparison result by one data period, and to output the delayed data as pre-emphasis data; and a pre-emphasis driving unit configured to receive the pre-emphasis data and to drive the received data to the data output pad.

18 Claims, 6 Drawing Sheets

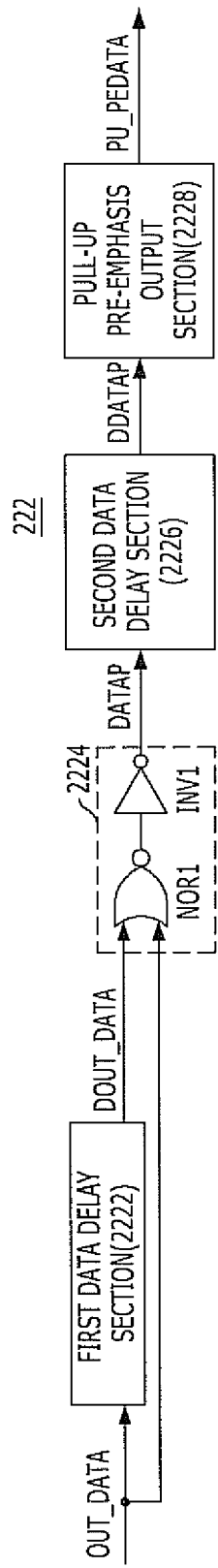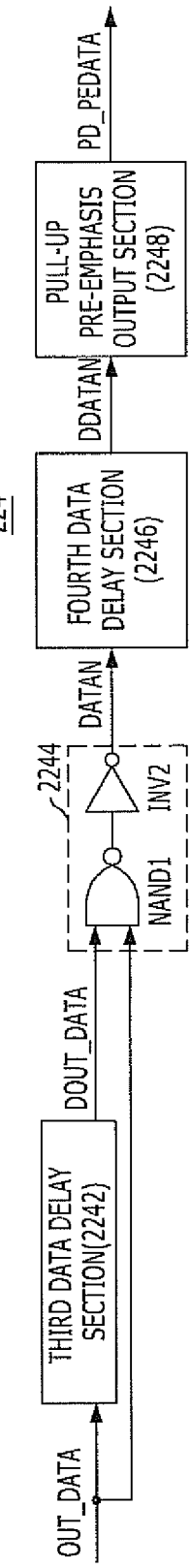

SEMICONDUCTOR DEVICE FOR PERFORMING PREEMPHASIS OPERATION

CROSS-REFERENCE TO RELATED APPLICATIONS

The present application claims priority of Korean Patent Application No. 10-2011-0116036, filed on Nov. 8, 2011, which is incorporated herein by reference in its entirety.

BACKGROUND

1. Field

Exemplary embodiments of the present invention relate to semiconductor design technology, and more particularly, to a semiconductor device including a data output circuit to support a pre-emphasis operation.

2. Description of the Related Art

FIG. 1A is a block diagram illustrating a conventional data output circuit.

Referring to FIG. 1A, the conventional data output circuit includes a pull-up pre-main driver 110, a pull-up main driver 120, a pull-down pre-main driver 130, and a pull-down main driver 140.

The pull-up pre-main driver 110 and the pull-down pre-main driver 130 are configured to invert and drive output data OUT_DATA and to output pull-up drive data PU_PMDATA and pull-down drive data PD_PMDATA, respectively.

The pull-up main driver 120 is configured to drive a data output pad DQ to an external power supply voltage VDD in a period where the pull-up drive data PU_PMDATA is at a logic low level.

The pull-down main driver 140 is configured to drive the data output pad DQ to an external ground voltage VSS in a period where the pull-down drive data PD_PMDATA is at a logic high level.

FIG. 1B is a timing diagram explaining an operation of the conventional data output circuit illustrated in FIG. 1A.

Referring to FIG. 1B, it can be seen that, when the output data OUT_DATA driven to the data output pad DQ maintain the same logic level during two or more data periods, the voltage level of the data output pad DQ rises more than or drops less than a normal level, that is, the voltage level of the data output pad DQ varies.

Specifically, in a period 1 where the output data OUT_DATA driven to the data output pad DQ maintains a logic low level during two data periods, the voltage level of the data output pad DQ drops slightly more than a normal voltage level corresponding to a logic low level.

When the output data OUT_DATA driven to the data output pad DQ changes from a logic low level to a logic high level after the voltage level of the data output pad DQ dropped slightly more than the normal voltage level corresponding to a logic low level, the voltage level of the data output pad DQ becomes slightly lower than the normal voltage level corresponding to a logic high level (2). In FIG. 1B, the period where the data output pad DQ maintains a voltage level which is slightly lower than a normal voltage level corresponding to a logic high level corresponds to only one data period. However, since such a phenomenon repetitively occurs, the voltage level variation of the data output pad DQ inevitably increases.

Then, in a period 3 where the output data OUT_DATA driven to the data output pad DQ maintains a logic high level during three data periods, the voltage level of the data output pad DQ rises slightly more than the normal voltage level corresponding to a logic high level.

When the output data OUT_DATA driven to the data output pad DQ changes from a logic high level to a logic low level after the voltage level of the data output pad DQ rose slightly more than the normal voltage level corresponding to a logic high level, the voltage level of the data output pad DQ becomes slightly higher than the normal voltage level corresponding to a logic low level (4). In FIG. 1B, the period where the data output pad DQ maintains a voltage level which is slightly higher than the normal voltage level corresponding to a logic low level corresponds to only one data period. However, since such a phenomenon repetitively occurs, the voltage level variation of the data output pad DQ inevitably increases.

In the above-described data output circuit, the voltage level of the data output pad DQ may become higher or lower than an expected level, according to the logic level of the output data OUT_DATA. Accordingly, jitter of the data OUT_DATA outputted through the data output pad DQ may increase, that is, inter symbol interference (ISI) may become serious. Furthermore, due to such a problem, a data valued window (tDV) of the data OUT_DATA outputted through the data output pad DQ may not be sufficiently secured. In this case, a data output error may occur.

SUMMARY

An embodiment of the present invention is directed to a data output circuit which performs a pre-emphasis operation when two output data which are successively inputted have the same logic level.

In accordance with an embodiment of the present invention, a semiconductor device includes: a main driving unit configured to receive an output data and to drive the received data to a data output pad; a pre-emphasis data generation unit configured to compare delayed data obtained by delaying the output data by one data period with the output data, to delay the comparison result by one data period, and to output the delayed data as pre-emphasis data; and a pre-emphasis driving unit configured to receive the pre-emphasis data and drive the received data to the data output pad.

In accordance with another embodiment of the present invention, a semiconductor device includes: a main driving unit configured to drive first to third output data, which are successively applied, to a data output pad; and a pre-emphasis driving unit configured to drive the data output pad in a drive direction opposite to logic levels of the first and second output data in response to an operation in which the third output data is driven to the data output pad if the first and second output data have the same logic level.

BRIEF DESCRIPTION OF THE DRAWINGS

FIGS. 3A and 3B are detailed circuit diagrams of a pull-up pre-emphasis data generator and a pull-down pre-emphasis data generator among components of the data output circuit of FIG. 2 in accordance with the first embodiment of the present invention.

DETAILED DESCRIPTION

Figure 1A:
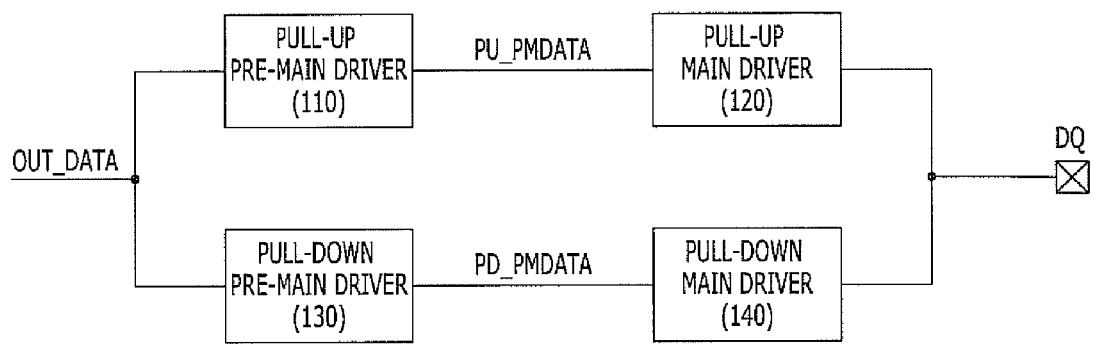
FIG. 1A is a block diagram illustrating a conventional data output circuit.
Figure 1B:
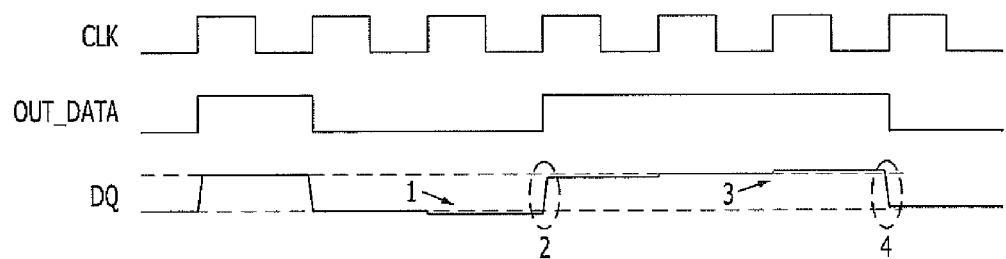
FIG. 1B is a timing diagram explaining an operation of the conventional data output circuit illustrated in FIG. 1A.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
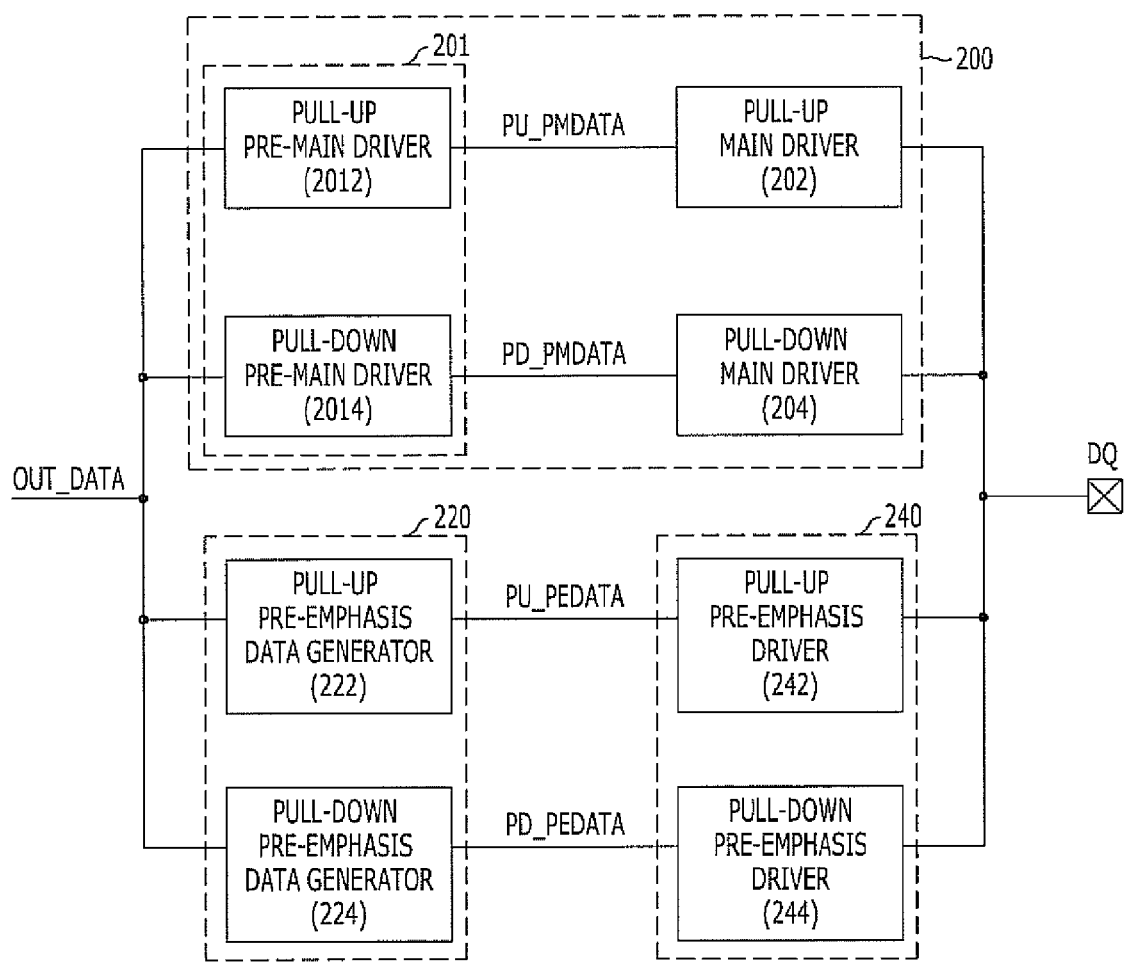
FIG. 2 is a block diagram illustrating a data output circuit in accordance with a first embodiment of the present invention.

FIG. 2 is a block diagram illustrating a data output circuit in accordance with an embodiment of the present invention.

Referring to FIG. 2, the data output circuit in accordance with the embodiment of the present invention includes a main driving unit 200, a pre-emphasis data generation unit 220, and a pre-emphasis driving unit 240. At this time, the main driving unit 200 includes a pre-main driver 201, a pull-up main driver 202, and a pull-down main driver 204. The pre-main driver 201 includes a pull-up pre-main driver 2012 and a pull-down pre-main driver 2014. Furthermore, the pre-emphasis data generation unit 220 includes a pull-up pre-emphasis data generator 222 and a pull-down pre-emphasis data generator 224. Furthermore, the pre-emphasis driving unit 240 includes a pull-up pre-emphasis driver 242 and a pull-down pre-emphasis driver 244.

FIGS. 3A and 3B are detailed circuit diagrams of the pull-up pre-emphasis data generator and the pull-down pre-emphasis data generator among the components of the data output circuit of FIG. 2 in accordance with the embodiment of the present invention.

Referring to FIG. 3A, the pull-up pre-emphasis data generator 222 includes a first data delay section 2222, a first logic operation section 2224, a second data delay section 2226, and a pull-up pre-emphasis output section 2228.

Referring to FIG. 3B, the pull-down pre-emphasis data generator 224 in accordance with the embodiment of the present invention includes a third data delay section 2242, a second logic operation section 2244, a fourth data delay section 2246, and a pull-down pre-emphasis output section 2248.

Referring to FIGS. 2, 3A, and 3B, the data output circuit in accordance with the embodiment of the present invention includes the main driving unit 200, the pre-emphasis data generation unit 220, and the pre-emphasis driving unit 240. The main driving unit 200 is configured to receive an output data OUT_DATA and drive the received data to a data output pad DQ. The pre-emphasis data generation unit 220 is configured to compare a delayed data DOUT_DATA obtained by delaying the output data OUT_DATA by one data period with the output data OUT_DATA, to delay the comparison result by one data period, and to output the delayed data as pre-emphasis data PU_PEDATA and PD_PEDATA. The pre-emphasis driving unit 240 is configured to receive the pre-emphasis data PU_PEDATA and PD_PEDATA and to drive the received data to the data output pad DQ.

Here, the data output circuit may operate based on a clock signal CLK. Therefore, one data period of the output data OUT_DATA may be decided based on the clock signal CLK. For example, when the data output circuit has a structure of outputting one output data OUT_DATA among a plurality of serialized output data at each cycle (1 tck) of the clock signal CLK, one data period may correspond to one cycle of the clock signal CLK. However, when the data output circuit has a structure of outputting one output data OUT_DATA among a plurality of serialized output data at each half cycle (tck/2) of the clock signal CLK, one data period may correspond to a half cycle of the clock signal CLK.

Therefore, although FIG. 3A does not illustrates the detailed configuration of circuits for delaying the output data OUT_DATA by one data period, that is, the data delay sections 2222 and 2242 of the pre-emphasis data generation unit 220, it can be seen that the circuits use a delay in a latch type configured in synchronization with the clock signal CLK.

Specifically, the pre-emphasis data generation unit 220 includes the pull-up pre-emphasis data generator 222 and the pull-down pre-emphasis data generator 224. The pull-up pre-emphasis data generator 222 is configured to generate a pull-up pre-emphasis data PU_PEDATA which is activated to a logic low level if the logic levels of the delayed data DOUT_DATA and the output data OUT_DATA are at a logic low level. The pull-down pre-emphasis data generator 224 is configured to generate a pull-down pre-emphasis data PD_PEDATA which is activated to a logic high level if the logic levels of the delayed data DOUT_DATA and the output data OUT_DATA are at a logic high level.

The main driving unit 200 includes the pre-main driver 201, the pull-up main driver 202, and the pull-down main driver 204. The pre-main driver 201 is configured to invert and drive the output data OUT_DATA. The pull-up main driver 202 is configured to pull-up drive the data output pad DQ to a logic high level if the data PU_PMDATA and PD_PMDATA outputted from the pre-main driver 202 are at a logic low level. The pull-down main driver 204 is configured to pull-down drive the data output pad DQ to a logic low level if the data PU_PMDATA and PD_PMDATA outputted from the pre-main driver 201 are at a logic high level. The pre-main driver 201 includes the pull-up pre-main driver 2012 and the pull-down pre-main driver 2014. The pull-up pre-main driver 2012 is configured to invert and drive the output data OUT_DATA and to generate the pull-up data PU_PMDATA to be applied to the pull-up main driver 202. The pull-down pre-main driver 2014 is configured to invert and drive the output data OUT_DATA and generate the pull-down data PD_PMDATA to be applied to the pull-up main driver 204.

The pre-emphasis driving unit 240 includes the pull-up pre-emphasis driver 242 and the pull-down pre-emphasis driver 244. The pull-up pre-emphasis driver 242 is configured to pull-up drive the data output pad DQ to a logic high level in a period where the pull-up pre-emphasis data PU_PEDATA is activated to a logic low level. The pull-down pre-emphasis driver 244 is configured to pull-down drive the data output pad DQ to a logic low level in a period where the pull-down pre-emphasis data PD_PEDATA is activated to a logic high level.

The pull-up pre-emphasis data generator 222 includes the first data delay section 2222, the first logic operation section 2224, the second data delay section 2226, and the pull-up pre-emphasis data output section 2228. The first data delay section 2222 is configured to delay the output data OUT_DATA by one data period and to output the delayed data DOUT_DATA. The first logic operation section 2224 is configured to receive the delayed data DOUT_DATA and the output data OUT_DATA and to perform an OR operation on the received data. The second data delay section 2226 is configured to delay an output signal DATAP of the first logic operation section 2224 by one data period. The pull-up pre-emphasis output section 2228 is configured to output an output signal DDATAP of the second data delay section 2226 as the pull-up pre-emphasis data PU_PEDATA which toggles to a logic low level during a preset period if the output signal DDATAP is activated to a logic low level. The first logic operation 2224 includes a NOR gate NOR1 and an inverter INV1. The NOR gate NOR1 is configured to receive the output data OUT_DATA and the delayed data DOUT_DATA and to perform an NOR operation on the received data. The inverter INV1 is configured to invert and output an output signal of the NOR gate NOR1.

The pull-down pre-emphasis data generator 224 includes the third data delay section 2242, the second logic operation section 2244, the fourth data delay section 2246, and the pull-down pre-emphasis data output section 2248. The third data delay section 2242 is configured to delay the output data OUT_DATA by one data period and to output the delayed data DOUT_DATA. The second logic operation section 2244 is configured to receive the delayed data DOUT_DATA and the output data OUT_DATA and to perform an AND operation on the received data. The fourth data delay section 2246 is configured to delay an output signal DATAN of the second logic operation section 2244 by one data period. The pull-up pre-emphasis data output section 2248 is configured to output an output signal DDATAN of the fourth data delay section 2246 as the pull-down pre-emphasis data PD_PEDATA which toggles to a logic high level during a preset period, if the output signal DDATAN is activated to a logic high level.

Based on the above-described configuration, the operation of the data output circuit in accordance with the embodiment of the present invention will be described with reference to FIG. 6.

The logic level of the output data OUT_DATA is maintained at a logic high level during one data period DATA_A. Then, the logic level of the output data OUT_DATA changes to a logic low level and is maintained at a logic low level during two data periods DATA_B and DATA_C. Then, the logic level of the output data OUT_DATA changes to a logic high level and is maintained at a logic high level during two data periods DATA_D and DATA_E. Then, the logic level of the data output OUT_DATA changes to a logic low level and is maintained at a logic low level during one data period DATA_F.

First, during the period DATA_A where the output data OUT_DATA has a logic high level, the data output pad DQ maintains a normal voltage level corresponding to a logic high level.

Then, during the first data period DATA_B of the data periods DATA_B and DATA_C (1) where the output data OUT_DATA changes to a logic low level and maintains a logic low level, the data output pad DQ maintains a normal voltage level corresponding to a logic low level. During the second data period DATA_C, however, the data output pad DQ has a lower voltage level than the normal voltage level corresponding to a logic low level.

However, if the logic level of the output data OUT_DATA changes to a logic high level, the voltage level of the data output pad DQ sufficiently rises to the normal voltage level corresponding to a logic high level (2).

The reason why the voltage level of the data output pad DQ sufficiently rises to the normal voltage level corresponding to a logic high level even in a state where the voltage level of the data output pad DQ is lower than the normal voltage level corresponding to a logic low level may be described as follows.

First, the pull-up pre-emphasis data generator 222 and the pull-down pre-emphasis data generator 224 commonly compare the delayed data DOUT_DATA obtained by delaying the output data OUT_DATA by one data period with the output data OUT_DATA. At this time, since the logic levels thereof are equal to each other at a logic low level, the first logic operation section 2224 included in the pull-up pre-emphasis data generator 222 activates the output signal DATAP to a logic low level, and the second logic operation section 2242 included in the pull-down pre-emphasis data generator 224 continuously maintains the output signal DATAN in a deactivation state at a logic low level. Therefore, the pull-up pre-emphasis data generator 222 continuously performs the subsequent operation, and the pull-down pre-emphasis data generator 224 does not perform the subsequent operation.

In this way, the second data delay section 2226 outputs the signal DATAP, which is activated to a logic low level by the operation of the first logic operation section 2224 included in the pull-up pre-emphasis data generator 222, as the signal DDATAP delayed by one data period. Subsequently, the pull-up pre-emphasis output section 2228 outputs the pull-up pre-emphasis data PU_PEDATA which toggles to a logic low level during a preset time if the output signal DDATAP of the second data delay section 2226 is activated to a logic low level.

At this time, the time point where the pull-up pre-emphasis data PU_PEDATA is activated to a logic low level by the operation of the second data delay section 2226 is equalized to the time point where the output data OUT_DATA changes from a logic low level to a logic high level.

In this way, if the output data DATA_OUT changes to a logic high level after maintaining a logic low level during two data periods, not only the pull-up main driver 202 is activated to perform a pull-up driving operation, but also the pull-up pre-emphasis driver 242 is activated to perform a pull-up driving operation.

Therefore, if the output data OUT_DATA changes to a logic high level even in a state where the voltage level of the data output pad DQ becomes lower than the normal voltage level corresponding to a logic low level because the output data OUT_DATA maintains a logic low level during two or more data periods, the voltage level of the data output pad DQ may be sufficiently increased to the normal voltage level corresponding to a logic high level.

Furthermore, during the first data period DATA_D of the two periods DATA_D and DATA_E (3) where the output data OUT_DATA changes to a logic high level and maintains a logic high level, the data output pad DQ maintains the normal voltage level corresponding to a logic high level. During the second data period DATA_E, however, the data output pad DQ has a higher voltage level than the normal voltage level corresponding to a logic high level.

However, when the logic level of the output data OUT_DATA changes to a logic low level, the voltage level of the data output pad PQ sufficiently drops to the normal voltage level corresponding to a logic low level (4).

The reason why the voltage level of the data output pad DQ sufficiently drops to the normal voltage level corresponding to a logic low level even in a state where the voltage level of the data output pad DQ is higher than the normal voltage level corresponding to a logic high level may be described as follows.

First, the pull-up pre-emphasis data generator 222 and the pull-down pre-emphasis data generator 224 commonly compare the delayed data DOUT_DATA obtained by delaying the output data OUT_DATA by one data period with the output data OUT_DATA. At this time, since the logic levels thereof are equal to each other at a logic high level, the first logic operation section 2224 included in the pull-up pre-emphasis data generator 222 maintains the output signal DATAP in a deactivation state at a logic high level, and the second logic operation section 2242 included in the pull-down pre-emphasis data generator 224 activates the output signal DATAN to a logic high level. Therefore, the pull-up pre-emphasis data generator 222 does not perform the subsequent operation, and the pull-down pre-emphasis data generator 224 continuously performs the subsequent operation.

In this way, the fourth data delay section 2246 outputs the signal DATAN, which is activated to a logic high level by the operation of the second logic operation section 2244 included in the pull-down emphasis data generator 224, as the signal DDATAN delayed by one data period. Subsequently, the pull-down pre-emphasis output section 2248 outputs the pull-down pre-emphasis data PD_PEDATA which toggles to a logic high level during a preset time if the output signal DDATAN of the fourth data delay section 2246 is activated to a logic high level.

At this time, the time point where the pull-down pre-emphasis data PD_PEDATA is activated to a logic high level by the operation of the fourth data delay section 2246 is equalized to the time point where the output data OUT_DATA changes from a logic high level to a logic low level.

In this way, when the output data OUT_DATA changes to a logic low level after maintaining a logic high level during two data periods, not only the pull-down main driver 204 is activated to perform a pull-down driving operation, but also the pull-down pre-emphasis driver 244 is activated to perform a pull-down driving operation.

Therefore, if the output data OUT_DATA changes to a logic low level even in a state where the voltage level of the data output pad DQ becomes higher than the normal voltage level corresponding to a logic high level because the output data OUT_DATA maintains a logic high level during two or more data periods, the voltage level of the data output pad DQ may be sufficiently decreased to the normal voltage level corresponding to a logic low level.

For reference, the preset time used as a reference time in the pull-up pre-emphasis output section 2228 and the pull-down pre-emphasis output section 2248 is previously decided by a designer so that the voltage level of the data output pad DQ exhibits a minimum variation.

Furthermore, according to the above-described operation, the period where the output data OUT_DATA maintain the same logic level does not exceed two data periods, and thus the pre-emphasis driving unit 240 seems to operate only in a state where the logic level of the output data OUT_DATA changes from a logic low level to a logic high level or from a logic high level to a logic low level.

However, the pre-emphasis driving unit 240 in accordance with the embodiment of the present invention operates if the period where the output data OUT_DATA maintain the same logic level is maintained during two or more data periods.

For example, if the output data OUT_DATA enters the next data period after maintaining a logic low level during two data periods, the pull-up pre-emphasis driver 242 operates to control the voltage level of the data output pad DQ not to drop by a predetermined difference or more from the normal voltage level corresponding to a logic low level. On the other hand, if the output data OUT_DATA enters the next data period after maintaining a logic high level during two data periods, the pull-down pre-emphasis driver 244 operates to control the voltage level of the data output pad DQ not to rise by a predetermined difference or more from the normal voltage level corresponding to a logic high level.

When the above-described semiconductor integrated circuit in accordance with the embodiment of the present invention is applied, the voltage level variation of the data output pad DQ may be minimized even when the case where the output data OUT_DATA have the same logic level during two or more data periods repetitively occurs.

Therefore, it is possible to improve the ISI in which jitter of the output data OUT_DATA outputted through the data output pad DQ increases.

Accordingly, it is possible to sufficiently secure a tDV of the data OUT_DATA outputted through the data output pad DQ.

Figure 4:
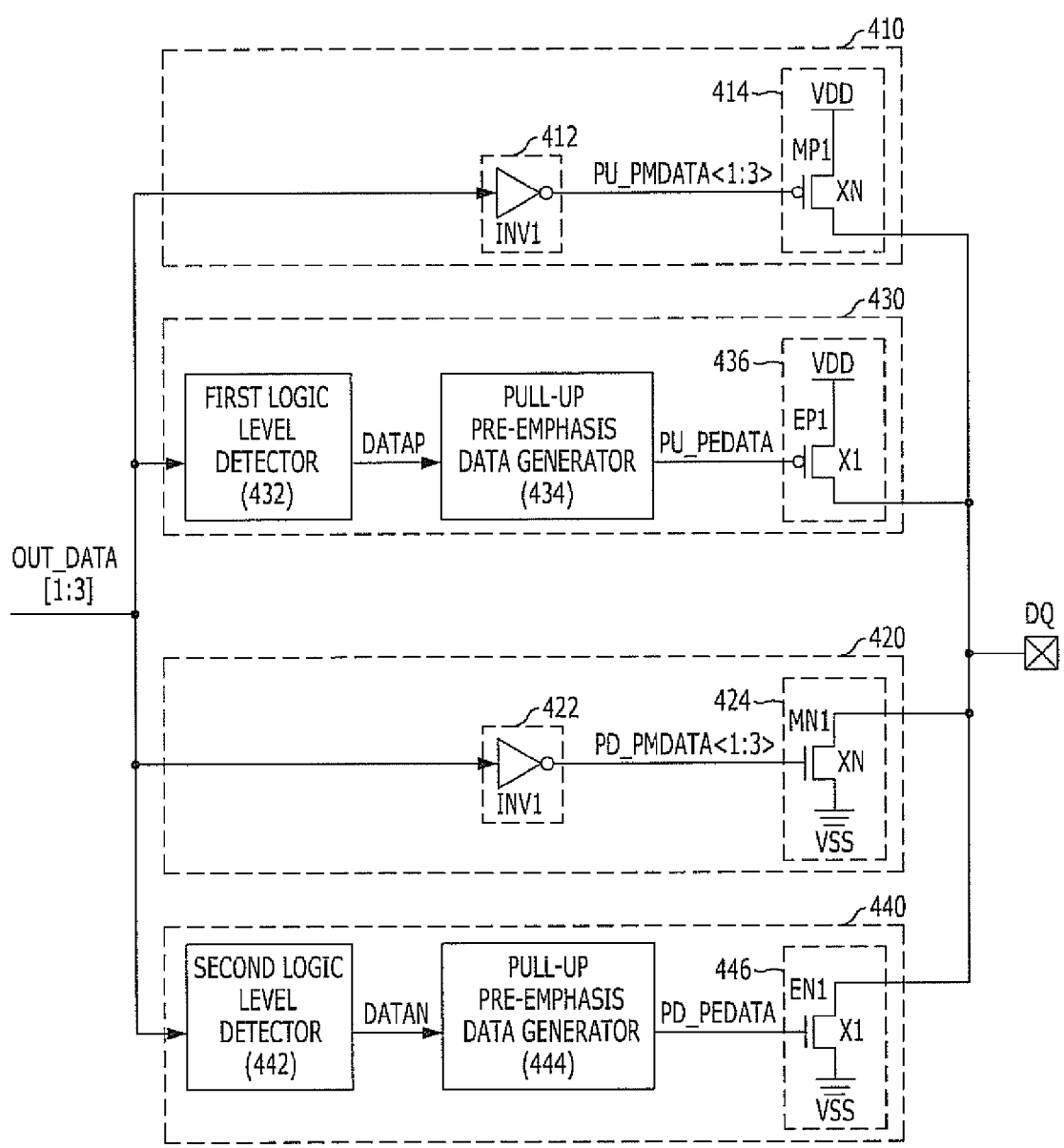
FIG. 4 is a block diagram illustrating a data output circuit in accordance with a second embodiment of the present invention.

FIG. 4 is a block diagram illustrating a data output circuit in accordance with another embodiment of the present invention.

Referring to FIG. 4, the data output circuit in accordance with the embodiment of the present invention includes main driving units 410 and 420 and pre-emphasis driving units 430 and 440. At this time, the main driving units 410 and 420 include pre-main drivers 412 and 422, a pull-up main driver 414, and a pull-down main driver 424, and the pre-main drivers 412 and 422 include a pull-up pre-main driver 412 and a pull-down pre-main driver 422. Furthermore, the pre-emphasis driving units 430 and 440 include a pull-up pre-emphasis driving unit 430 and a pull-down pre-emphasis driving unit 440. The pull-up pre-emphasis driving unit 430 includes a first logic level detector 432, a pull-up pre-emphasis data generator 434, and a pull-up pre-emphasis driver 436, and the pull-down pre-emphasis driving unit 440 includes a second logic level detector 442, a pull-down pre-emphasis data generator 444, and a pull-down pre-emphasis driver 446.

Figure 5A:
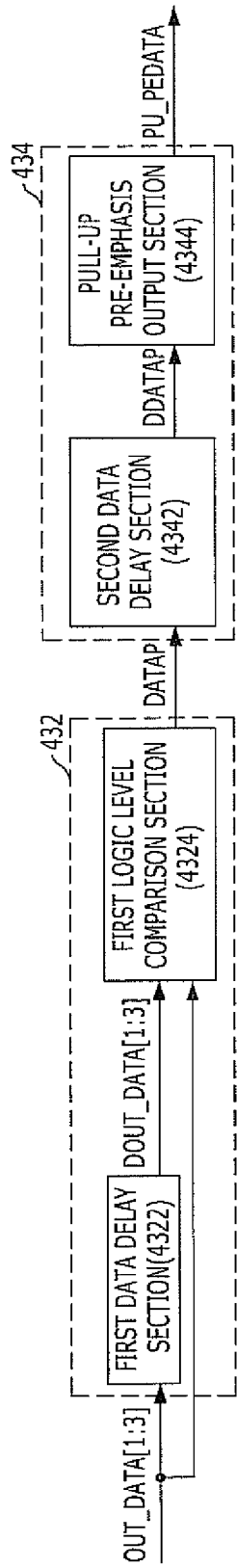
FIG. 5A is a detailed block diagram of a first logic level detector a pull-up pre-emphasis data generator among components of the data output circuit of FIG. 4 in accordance with the second embodiment of the present invention.
Figure 5B:
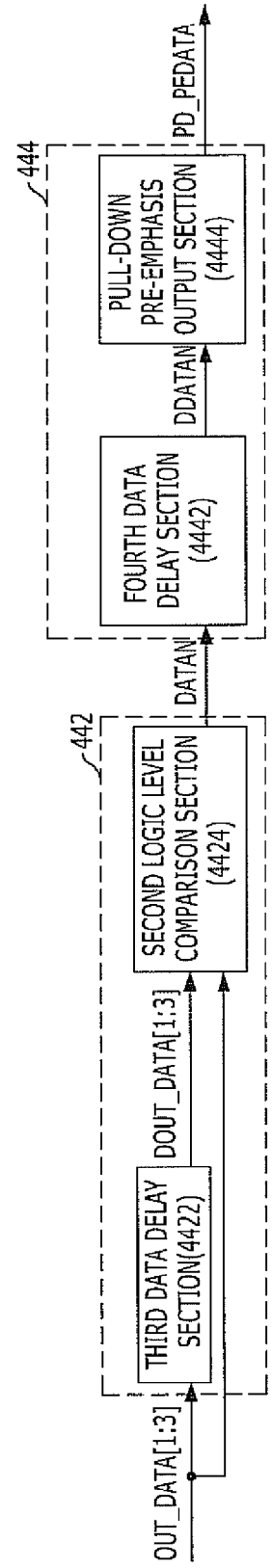
FIG. 5B is a detailed block diagram of a second logic level detector and a pull-down pre-emphasis data generator among the components of the data output circuit of FIG. 4 in accordance with the second embodiment of the present invention.

FIG. 5A is a detailed block diagram of the first logic level detector and the pull-up pre-emphasis data generator among the components of the data output circuit of FIG. 4 in accordance with the embodiment of the present invention. FIG. 5B is a detailed block diagram of the second logic level detector and the pull-down pre-emphasis data generator among the components of the data output circuit of FIG. 4 in accordance with the embodiment of the present invention.

Referring to FIG. 5A, the first logic level detector 432 in accordance with the second embodiment of the present invention includes a first data delay section 4322 and a logic level comparison section 4324, and the pull-up pre-emphasis data generator 434 includes a second data delay section 4342 and a pull-up pre-emphasis output section 4344.

Referring to FIG. 5B, the second logic level detector 442 in accordance with the embodiment of the present invention includes a third data delay section 4422 and a second logic level comparison section 4424, and the pull-down pre-emphasis data generator 444 includes a fourth data delay section 4442 and a pull-down pre-emphasis output section 4444.

Referring to FIGS. 4, 5A, and 5B, the data output circuit in accordance with the embodiment of the present invention includes the main driving units 410 and 420 and the pre-emphasis driving units 430 and 440. The main driving units 410 and 420 are configured to drive first to third output data OUT_DATA[1:3], which are successively applied, to a data output pad DQ. The pre-emphasis driving units 430 and 440 are configured to drive the data output pad DQ in a drive direction opposite to the logic level of the first and second output data OUT_DATA[1:2] if the third output data OUT_

DATA[3] is driven to the data output pad DQ, in a case where the first and second output data OUT_DATA[1:2] have the same logic level.

Here, the main driving units 410 and 420 have drivability N times larger than the pre-emphasis driving units 430 and 440 where N is an integer larger than two. That is, a driver MP1 for pull-up driving the data output pad DQ and a driver MN1 for pull-down driving the data output pad DQ in the main driving units 410 and 420 have a size N times larger than a driver EP1 for pull-up driving the data output pad DQ and a driver EN1 for pull-down driving the data output pad DQ in the pre-emphasis driving units 430 and 440.

The pre-emphasis driving units 430 and 440 include the pull-up emphasis driving unit 430 and the pull-down emphasis driving unit 440. The pull-up emphasis driving unit 430 is configured to pull-up drive the data output pad DQ toward a logic high level during a preset time from a time point where the third output data OUT_DATA[3] is driven to the data output pad DQ if both of the first and second output data OUT_DATA[1:2] are at a logic low level. The pull-down emphasis driving unit 440 is configured to pull-down drive the data output pad DQ toward a logic low level during a preset time from a time point where the third output data OUT_DATA[3] is driven to the data output pad DQ if both of the first and second output data OUT_DATA[1:2] are at a logic high level.

Furthermore, the main driving units 410 and 420 include the pre-main drivers 412 and 422 configured to invert and drive the first to third output data OUT_DATA[1:3]. The pull-up main driver 414 is configured to pull-up drive the data output pad DQ to a logic high level if data PU_PMDATA and PD_PMDATA outputted from the pre-main drivers 412 and 422 are at a logic low level. The pull-down main driver 424 is configured to pull-down drive the data output pad DQ to a logic low level if the data PU_PMDATA and PD_PMDATA outputted from the pre-main drivers 412 and 422 are at a logic high level.

The pull-up emphasis driving unit 430 includes the first logic level detector 432, the pull-up pre-emphasis data generator 434, and the pull-up emphasis driver 436. The first logic level detector 432 is configured to detect that both of the first and second output data OUT_DATA[1:2] become a logic low level. The pull-up pre-emphasis data generator 434 is configured to generate the pull-up pre-emphasis data PU_PMDATA of which the activation is decided in response to an output signal DATAP of the first logic level detector 432, at a time point where the third output data OUT_DATA[3] is driven to the data output pad DQ. The pull-up emphasis driver 436 is configured to pull-up drive the data output pad DQ to a logic high level in a period where the pull-up pre-emphasis data PU_PMDATA is activated.

Here, the first logic level detector 432 includes the first data delay section 4322 and the first logic level comparison section 4324. The first data delay section 4322 is configured to delay the first output data OUT_DATA[1] to a time point where the second output data OUT_DATA[2] is driven to the data output pad DQ. The first logic level comparison section 4324 is configured to compare the logic levels of the delayed first output data DOUT_DATA[1] outputted from the first output delay section 4322 and the second output data OUT_DATA[2], and to generate an output signal DATAP having a logic low level in a period where the logic levels of the first and second output data OUT_DATA[1:2] are at a logic low level.

The pull-up pre-emphasis data generator 434 includes the second data delay section 4342 and the pull-up pre-emphasis data output section 4344. The second data delay section 4342 is configured to delay the output signal DATAP of the first logic level comparison section 4324 to a time point where the third output data OUT_DATA[3] is driven to the data output pad DQ. The pull-up pre-emphasis data output section 4344 is configured to output the pull-up pre-emphasis data PU_PEDATA which is activated to a logic low level during a preset time an output signal DDATAP of the second data delay section 4342 is at a logic low level.

The pull-up emphasis driver 436 includes a PMOS transistor EP1 having a source coupled to an external power supply voltage terminal VDD and a drain coupled to the data output pad DQ and configured to drive the data output pad DQ to the external power supply voltage VDD in a period where the pull-up pre-emphasis data PU_PEDATA applied to a gate thereof is activated to a logic low level, so that the data output pad DQ is driven toward a logic high level.

The pull-down emphasis driving unit 440 includes the second logic level detector 442, the pull-down pre-emphasis data generator 444, and the pull-down emphasis driver 446. The second logic level detector 442 is configured to detect that both of the first and second output data OUT_DATA[1:2] become a logic high level. The pull-down pre-emphasis data generator 444 is configured to generate the pull-down pre-emphasis data PD_PEDATA of which the activation is decided in response to an output signal DATAN of the second logic level detector 442, at a time point where the third output data OUT_DATA[3] is driven to the data output pad DQ. The pull-down emphasis driver 446 is configured to drive the data output pad DQ toward a logic low level in a period where the pull-down pre-emphasis data PD_PEDATA is activated.

Here, the second logic level detector 442 includes the third data delay section 4422 and the second logic level comparison section 4424. The third data delay section 4422 is configured to delay the first output data OUT_DATA[1] to a time point where the second output data OUT_DATA[2] is driven to the data output pad DQ. The second logic level comparison section 4424 is configured to compare the logic levels of the delayed first output data DOUT_DATA[1] outputted from the third output delay section 4422 and the second output data OUT_DATA[2], and to generate an output signal DATAN having a logic high level in a period where the logic levels of the first and second output data OUT_DATA[1:2] are at a logic high level.

The pull-up pre-emphasis data generator 444 includes the fourth data delay section 4442 and the pull-down pre-emphasis data output section 4444. The fourth data delay section 4442 is configured to delay the output signal DATAN of the second logic level comparison section 4424 to a time point where the third output data OUT_DATA[3] is driven to the data output pad DQ. The pull-down pre-emphasis data output section 4444 is configured to output the pull-down pre-emphasis data PU_PEDATA which is activated to a logic high level during a preset time if an output signal DDATAP of the fourth data delay section 4442 is at a logic high level.

The pull-up emphasis driver 446 includes a NMOS transistor NP1 having a drain coupled to the data output pad DQ and a source coupled to an external ground voltage terminal VSS. The PMOS transistor EP1 is configured to drive the data output pad DQ to the external ground voltage VSS in a period where the pull-down pre-emphasis data PD_PEDATA applied to a gate thereof is activated to a logic high level, so that the data output pad DQ is driven toward a logic low level.

Based on the above-described configuration, the operation of the data output circuit in accordance with the embodiment of the present invention will be described with reference to FIG. 6.

Figure 6:
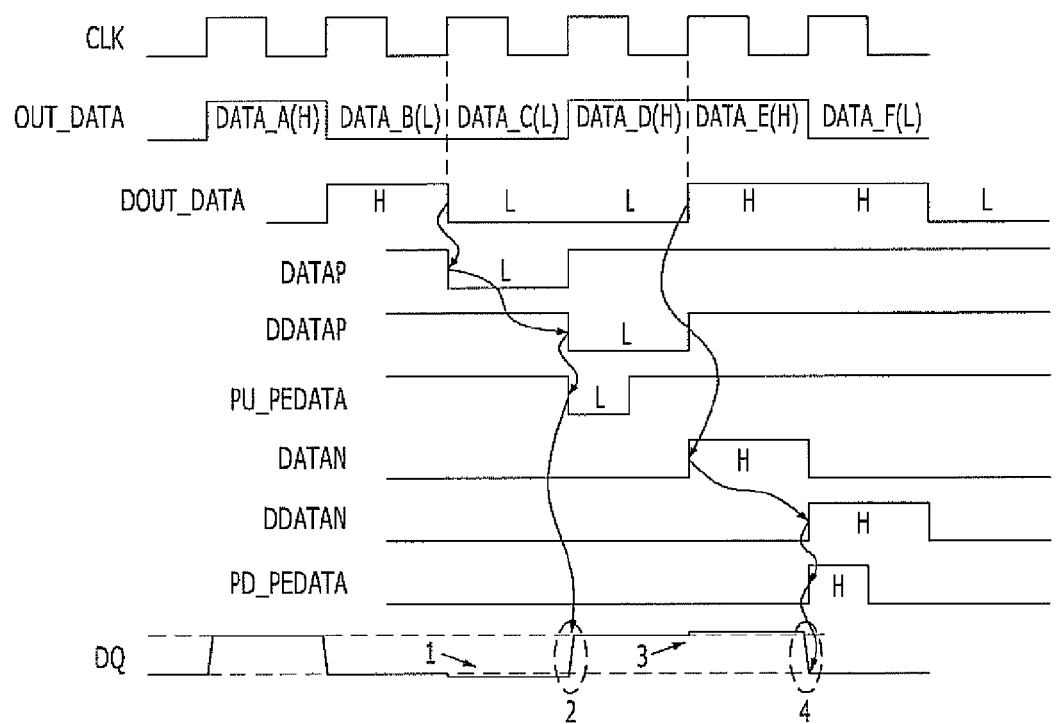
FIG. 6 is a timing diagram explaining the operation of the data output circuit in accordance with the first and second embodiments of the present invention.

In FIG. 6, the output data OUT_DATA are inputted over six steps based on the period of the clock signal CLK. Output data DATA_A applied for the first time has a logic high level, output data DATA_B and DATA_C applied for the second and third times have a logic low level, output data DATA_D and DATA_E applied for the fourth and fifth times have a logic high level, and output data DATA_F applied for the sixth time has a logic low level.

The first to third output data OUT_DATA[1:3] may be differently set according to an order where the six-step output data DATA_A, DATA_B, DATA_C, DATA_D, DATA_E, and DATA_F are applied.

For example, when the output data DATA_A applied for the first time corresponds to the first output data OUT_DATA[1], the output data DATA_B and DATA_C applied for the second and third times become the second and third output data OUT_DATA[2:3].

Similarly, when the output data DATA_D applied for the fourth time corresponds to the first output data OUT_DATA[1], the output data DATA_E and DATA_F applied for the fifth and six times become the second and third output data OUT_DATA[2:3].

If the output data DATA_A applied for the first time has a logic high level, the data output pad DQ maintains a normal voltage level corresponding to a logic high level.

Then, the output data DATA_B and DATA_C applied for the second and third times maintain a logic low level (1). At this time, the voltage level of the data output pad DQ, which corresponds to the output data DATA_B applied for the second time, is maintained at a normal voltage level corresponding to a logic low level, and the voltage level of the data output pad DQ, which corresponds the output data DATA_C applied for the third time, becomes lower than a normal voltage level corresponding to a logic low level.

However, when the output data DATA_D applied after the output data DATA_C changes from a logic low level to a logic high level, the voltage level of the data output pad DQ sufficiently rises to the normal voltage level corresponding to a logic high level (2).

The reason why the voltage level of the data output pad DQ sufficiently rises to the normal voltage level corresponding to a logic high level even in a state where the voltage level of the data output pad DQ is lower than the normal voltage level corresponding to a logic low level may be described as follows.

First, the first and second logic level detectors 432 and 442 commonly detect whether the data DATA_B and DATA_C applied for the second and third times, which correspond to the first and second output data OUT_DATA[1:2], have the same logic level or not. Specifically, the first and third data delay section 4322 and 4422 of the first and second logic level detectors 432 and 442 delay the data DATA_B corresponding to the first output data OUT_DATA[1] to a time point where the data DATA_C corresponding to the second output data OUT_DATA[2] is driven to the data output pad DQ, and the first and second logic level comparison sections 4324 and 4424 compare the logic levels of the data. At this time, since the logic levels of the output data DATA_B and DATA_C applied for the second and third times are equal to each other at a logic low level, the first logic level comparison section 4324 included in the first logic level detector 432 activates the output signal DATAP to a logic low level, and the second logic level comparison section 4424 included in the second logic level detector 442 maintains the output data DATAN in a deactivation state at a logic low level. Therefore, the pull-up pre-emphasis driving unit 430 continuously performs the subsequent operation, and the pull-down pre-emphasis driving unit 440 does not perform the subsequent operation.

In this way, the second data delay section 4342 included in the pull-up pre-emphasis data generator 434 delays the signal DATAP, which is activated to a logic low level by the operation of the first logic level detector 432 included in the pull-up pre-emphasis driving unit 430, to a time point where the output data DATA_D corresponding to the third output data OUT_DATA[3] is driven to the data output pad DQ. Subsequently, the pull-up pre-emphasis data output section 4344 outputs the pull-up pre-emphasis data PU_PEDATA which toggles to a logic low level during a preset time if the output signal DDATAP of the second data delay section 4342 is activated to a logic low level.

At this time, the period where the third output data OUT_DATA[3] is driven to the data output pad DQ corresponds to the time point where the output data DATA_D is applied. At this time point, the logic level of the data output pad DQ changes from a logic low level to a logic high level.

In this way, if the first and second output data OUT_DATA[1:2] maintain a logic low level, not only the third output data OUT_DATA[3] is driven to the data output pad DQ through the main driving units 410 and 420, but also the data output pad DQ is driven to the external power supply level corresponding to a logic high level through the pull-up pre-emphasis driving unit 430.

Therefore, the voltage level of the data output pad DQ may be sufficiently increased to the normal voltage level corresponding to a logic high level at a time point where the third output data OUT_DATA[3] having a logic high level is driven to the data output pad DQ even in a state where the voltage level of the data output pad DQ becomes lower than the normal voltage level corresponding to a logic low level because both of the first and second output data OUT_DATA[1:2] have a logic low level.

Furthermore, the output data DATA_D and DATA_E applied for the fourth and fifth times maintain a logic high level (3). At this time, the voltage level of the data output pad DQ, which corresponds to the output data DATA_D applied for the fourth time, is maintained at the normal voltage level corresponding to a logic high level, and the voltage level of the data output pad DQ, which corresponds to the output data DATA_E applied for the fifth time, becomes higher than the normal voltage level corresponding to a logic high level.

However, when the logic level of the output data DATA_F applied after the output data DATA_E changes from a logic high level to a logic low level, the voltage level of the data output pad DQ sufficiently drops to the normal voltage level corresponding to a logic low level (4).

The reason why the voltage level of the data output pad DQ sufficiently drops to the normal voltage level corresponding to a logic low level even in a state where the voltage level of the data output pad DQ is higher than the normal voltage level corresponding to a logic high level may be described as follows.

First, the first and second logic level detectors 432 and 442 commonly detect whether the output data DATA_D and DATA_E applied for the fourth and fifth times, which correspond to the first and second output data OUT_DATA[1:2], have the same logic level or not. Specifically, the first and third data delay section 4322 and 4422 of the first and second logic level detectors 432 and 442 delay the output data DATA_D corresponding to the first output data OUT_DATA[1] to a time point where the output data DATA_E corresponding to the second output data OUT_DATA[2] is driven to the data output pad DQ, and the first and second logic level comparison sections 4324 and 4424 compare the logic levels of the output data. At this time, since the logic levels of the output data DATA_D and DATA_E applied for the fourth and fifth times are equal to each other at a logic high level, the first logic level comparison section 4324 included in the first logic level detector 432 maintains the output signal DATAP in a deactivation state at a logic high level, and the second logic level comparison section 4424 included in the second logic level detector 442 activate the output data DATAN to a logic high level. Therefore, the pull-up pre-emphasis driving unit 430 does not perform the subsequent operation, and the pull-down pre-emphasis driving unit 440 continuously performs the subsequent operation.

In this way, the fourth data delay section 4442 included in the pull-down pre-emphasis data generator 444 delays the signal DATAN, which is activated to a logic high level by the operation of the first logic level detector 442 included in the pull-down pre-emphasis driving unit 440, to a time point where the output data DATA_F applied for the sixth time, which corresponds to the third output data OUT_DATA[3], is driven to the data output pad DQ. Subsequently, the pull-down pre-emphasis data output section 4444 outputs the pull-down pre-emphasis data PD_PEDATA which toggles to a logic low level during a preset time, in response to when the output signal DDATAN of the fourth data delay section 4442 is activated to a logic high level.

At this time, the period where the third output data OUT_DATA[3] is driven to the data output pad DQ corresponds to the time point where the output data DATA_F is applied. At this time point, the logic level of the data output pad DQ changes from a logic high level to a logic low level.

In this way, if the first and second output data OUT_DATA[1:2] maintain a logic high level, not only the third output data OUT_DATA[3] is driven to the data output pad DQ through the main driving units 410 and 420, but also the data output pad DQ is driven to the external ground voltage level corresponding to a logic low level through the pull-down pre-emphasis driving unit 440.

Therefore, the voltage level of the data output pad DQ may be sufficiently decreased to the normal voltage level corresponding to a logic low level at a time point where the third output data OUT_DATA[3] having a logic low level is driven to the data output pad DQ even in a state where the voltage level of the data output pad DQ becomes higher than the normal voltage level corresponding to a logic high level because both of the first and second output data OUT_DATA[1:2] have a logic high level.

For reference, the preset time used as a reference time in the pull-up pre-emphasis output section 4344 and the pull-down pre-emphasis output section 4444 is previously decided by a designer so that the voltage level of the data output pad DQ exhibits a minimum variation.

Furthermore, according to the above-described operation, the pre-emphasis driving units 430 and 440 seem to operate only in a state where the third output data OUT_DATA[3] has a logic level opposite to the first and second output data OUT_DATA[1:2] after the first and second output data OUT_DATA[1:2] have the same logic level.

However, the pre-emphasis driving units 430 and 440 in accordance with the embodiment of the present invention operate to pre-emphasis drive the third output data OUT_DATA[3] to an opposite logic level even when the first to third output data OUT_DATA[1:3] maintain the same logic level.

For example, if the third output data OUT_DATA[3] is at a logic low level in a state where the first and second output data OUT_DATA[1:2] are at a logic low level, the pull-up pre-emphasis driving unit 430 operates to pre-emphasis drive the data output pad DQ toward a logic high level at a time point where the third output data OUT_DATA[3] is driven to the data output pad DQ. Accordingly, when the third output data OUT_DATA[3] is driven to the data output pad DQ, the voltage level does not drop more than when the second output data OUT_DATA[2] is driven to the data output pad DQ. On the other hand, when the third output data OUT_DATA[3] is at a logic high level in a state where the first and second output data OUT_DATA[1:2] are at a logic high level, the pull-down pre-emphasis driving unit 440 operates to pre-emphasis drive the data output pad DQ toward a logic low level at a time point where the third output data OUT_DATA[3] is driven to the data output pad DQ. Accordingly, when the third output data OUT_DATA[3] is driven to the data output pad DQ, the voltage level does not rise more than when the second output data OUT_DATA[2] is driven to the data output pad DQ.

When the above-described data output circuit for driving the first to third output data OUT_DATA[1:3] to the data output pad DQ is applied, the voltage level variation of the data output pad DQ may be minimized at a time point where the third output data OUT_DATA[3] is driven to the data output pad DQ even when the third output data OUT_DATA[1:2] have the same logic level.

Therefore, it is possible to improve the ISI in which jitter of the output data OUT_DATA outputted through the data output pad DQ increases.

Accordingly, it is possible to sufficiently secure a tDV of the data OUT_DATA outputted through the data output pad DQ.

While the present invention has been described with respect to the specific embodiments, it will be apparent to those skilled in the art that various changes and modifications may be made without departing from the spirit and scope of the invention as defined in the following claims.

For example, the positions and types of the logic gates and transistors taken as examples in the above-described embodiments may be differently implemented depending on the polarities of input signals.

What is claimed is:

1. A semiconductor device comprising:
   a main driving unit configured to receive an output data and to drive the received data to a data output pad;
   a pre-emphasis data generation unit configured to compare a delayed data obtained by delaying the output data by one data period with the output data, to delay a comparison result by one data period, and to output a delayed comparison result as pre-emphasis data; and
   a pre-emphasis driving unit configured to receive the pre-emphasis data and to drive the received data to the data output pad,
   wherein the pre-emphasis driving unit operates when the data period where the output data maintain same logic level is maintained during two or more data periods.

2. The semiconductor device of claim 1, wherein the pre-emphasis data generation unit comprises:
   a pull-up pre-emphasis data generator configured to generate a pull-up pre-emphasis data which is activated to a logic low level if both of the delayed data and the output data are at a logic low level; and
   a pull-down pre-emphasis data generator configured to generate a pull-down pre-emphasis data which is activated to a logic high level if both of the delayed data and the output data are at a logic high level.

3. The semiconductor device of claim 1, wherein the main driving unit comprises:
   a pre-main driver configured to invert and drive the output data;
   a pull-up main driver configured to pull-up drive the data output pad to a logic high level if data outputted from the pre-main driver is at a logic low level; and a pull-down main driver configured to pull-down drive the data output pad to a logic low level if the data outputted from the pre-main driver is at a logic high level.

4. The semiconductor device of claim 3, wherein the pre-emphasis driving unit comprises:
a pull-up pre-emphasis driver configured to pull-up drive the data output pad to a logic high level in a period where the pull-up pre-emphasis data is activated to a logic low level; and
a pull-down pre-emphasis driver configured to pull-down drive the data output pad to a logic low level in a period where the pull-down pre-emphasis data is activated to a logic high level.

5. The semiconductor device of claim 4, wherein the pull-up pre-emphasis data generator comprises:
a first delay section configured to delay the output data by one data period and to output the delayed data;
a first logic operation section configured to receive the delayed data and the output data and to perform an OR operation on the received data;
a second data delay section configured to delay an output signal of the first logic operation section by one data period; and
a pull-up pre-emphasis data output section configured to output an output signal of the second data delay section as the pull-up pre-emphasis data which toggles to a logic low level during a preset time, if the output signal of the second data delay section is activated to a logic low level.

6. The semiconductor device of claim 4, wherein the pull-down pre-emphasis data generator comprises:
a third data delay section configured to delay the output data by one data period and to output the delayed data;
a second logic section configured to receive the delayed data and the output data and to perform an AND operation on the received data;
a fourth data delay section configured to delay an output signal of the second logic section by one data period; and
a pull-down pre-emphasis data output section configured to output an output signal of the fourth data delay section as the pull-down pre-emphasis data which toggles to a logic high level during a preset time if the output signal of the fourth data delay section is activated to a logic high level.

7. A semiconductor device comprising:
a main driving unit configured to drive first to third output data, which are successively applied, to a data output pad; and
a pre-emphasis driving unit configured to drive the data output pad in a drive direction opposite to logic levels of the first and second output data in response to an operation in which the third output data is driven to the data output pad, if the first and second output data have the same logic level.

8. The semiconductor device of claim 7, wherein the main driving unit has drivability N times larger than the pre-emphasis driving unit where N is an integer larger than two.

9. The semiconductor device of claim 8, wherein the pre-emphasis driving unit comprises:
a pull-up emphasis driving unit configured to pull-up drive the data output pad toward a logic high level during a preset time from a time point where the third output data is driven to the data output pad, if both of the first and second output data are at a logic low level; and
a pull-down emphasis driving unit configured to pull-down drive the data output pad toward a logic low level during a preset time from a time point where the third output data is driven to the data output pad, if both of the first and second output data are at a logic high level.

10. The semiconductor device of claim 9, wherein the main driving unit comprises:
a pre-main driver configured to invert and drive the first to third output data;
a pull-up main driver configured to pull-up drive the data output pad to a logic high level if data outputted from the pre-main driver is at a logic low level; and
a pull-down main driver configured to pull-down drive the data output pad to a logic low level if when the data outputted from the pre-main driver is at a logic high level.

11. The semiconductor device of claim 9, wherein the pull-up emphasis driving unit comprises:
a first logic level detector configured to detect that the logic levels of the first and second output data becomes a logic low level;
a pull-up pre-emphasis data generator configured to generate pull-up pre-emphasis data, of which activation is decided in response to an output signal of the first logic level detector, at a time point where the third output data is driven to the data output pad; and
a pull-up emphasis driver configured to pull-up drive the data output pad toward a logic high level in a period where the pull-up pre-emphasis data is activated.

12. The semiconductor device of claim 11, wherein the first logic level detector comprises:
a first data delay section configured to delay the first output data to a time point where the second output data is driven to the data output pad; and
a first logic level comparison section configured to compare logic levels of the delayed first output data outputted from the first data delay section and the second output data, and to generate an output signal having a logic low level in a period where the logic levels of the first and second output data are at a logic low level.

13. The semiconductor device of claim 12, wherein the pull-up pre-emphasis data generator comprises:
a second data delay section configured to delay the output signal of the first logic level comparison section to a time point where the third output data is driven to the data output pad; and
a pull-up pre-emphasis data output section configured to output the pull-up pre-emphasis data which is activated to a logic low level during a preset time, if a signal outputted from the second data delay section is at a logic low level.

14. The semiconductor device of claim 13, wherein the pull-up emphasis driver comprises a PMOS transistor having a source coupled to an external power supply voltage terminal and a drain coupled to the data output pad and configured to drive the data output pad to the external power supply voltage in a period where the pull-up pre-emphasis data applied to a gate thereof is activated to a logic low level so that the data output pad is driven toward a logic high level.

15. The semiconductor device of claim 9, wherein the pull-down emphasis driving unit comprises:
a second logic level detector configured to detect that the logic levels of the first and second data become a logic high level;
a pull-down pre-emphasis data generator configured to generate pull-down pre-emphasis data, of which activation is decided in response to an output signal of the second logic level detector, at a time point where the third output data is driven to the data output pad; and a pull-down emphasis driver configured to pull-down drive the data output pad toward a logic low level in a period where the pull-down pre-emphasis data is activated.

16. The semiconductor device of claim 15, wherein the second logic level detector comprises:

a third data delay section configured to delay the first output data to a time point where the second output data is driven to the data output pad; and a second logic level comparison section configured to compare logic levels of the delayed first output data outputted from the third data delay section and the second output data, and to generate an output signal having a logic high level in a period where the logic levels of the first and second output data are at a logic high level.

17. The semiconductor device of claim 16, wherein the pull-up pre-emphasis data generator comprises:

a fourth data delay section configured to delay the output signal of the second logic level comparison section to a time point where the third output data is driven to the data output pad; and a pull-up pre-emphasis data output section configured to output the pull-down pre-emphasis data which is activated to a logic high level during a preset time, if a signal outputted from the fourth data delay section is at a logic high level.

18. The semiconductor device of claim 17, wherein the pull-down emphasis driver comprises an NMOS transistor having a drain coupled to the data output pad and a source coupled to an external ground voltage terminal and configured to drive the data output pad to the external ground voltage in a period where the pull-down pre-emphasis data applied to a gate thereof is activated to a logic high level so that the data output pad is driven toward a logic low level.

* * * * *